United States Patent [19]

Washburn

[11] 4,041,382
[45] Aug. 9, 1977

[54] CALIBRATING A MEASUREMENT SYSTEM INCLUDING BRIDGE CIRCUIT

[75] Inventor: Ralph G. Washburn, Marion, Mass.

[73] Assignee: The Sippican Corporation, Marian, Mass.

[21] Appl. No.: 714,386

[22] Filed: Aug. 16, 1976

[51] Int. Cl.² .............................................. G01R 27/02
[52] U.S. Cl. ............................ 324/65 R; 73/362 AR; 73/170 A; 324/63; 324/130
[58] Field of Search ................. 324/65 R, 62, 63, 130; 73/362 AR, 170 A

[56] References Cited

U.S. PATENT DOCUMENTS

| | | | |
|---|---|---|---|
| 3,209,248 | 9/1965 | Siefert | 324/63 |
| 3,667,041 | 5/1972 | Senour | 324/130 |
| 3,794,915 | 2/1974 | Wofinger | 324/130 X |

*Primary Examiner*—Stanley T. Krawczewicz

[57] ABSTRACT

A measurement system of the type having a sensor the electrical resistance of which varies as a function of a parameter being measured, and a bridge circuit connected to the sensor, wherein a source of a reference voltage is provided to excite the bridge to produce a bridge output indicative of the parameter being measured when the bridge is balanced, the bridge output being dependent upon the sensor resistance and the reference voltage except that the system includes circuitry for causing the output to be independent of the reference voltage at one end of a range of values of the parameter, and output circuitry is provided for converting the bridge output into a system output in accordance with an output function, featuring, in one aspect, first calibration circuitry connected to the output circuitry to provide a first calibration signal for calibrating the system at one end of the range by controlling the output function; second calibration circuitry connected to the bridge circuit to provide a second calibration signal for calibrating the system at the other end of the range by controlling the effective value of the reference voltage supplied to the bridge circuit; sequencing circuitry for automatically causing the first calibration circuitry to calibrate the system at one end of the range, and then automatically causing the second calibration circuitry to calibrate the system at the other end of the range; and a control for activating said sequencing circuitry.

19 Claims, 3 Drawing Figures

CALIBRATING A MEASUREMENT SYSTEM INCLUDING BRIDGE CIRCUIT

The Government has rights in this invention pursuant to Contract No. N00014-76-C-0230 awarded by the Office of Naval Research, Department of the Navy.

BACKGROUND OF THE INVENTION

This invention relates to calibration of measurement systems of the type in which a sensor, the electrical resistance of which varies as a function of the parameter being measured, is electrically connected in one arm of a bridge circuit. The invention is particularly applicable to oceanography systems in which thermistors are used to measure water temperature, such as the system disclosed in U.S. patent application Ser. No. 608,030, filed Aug. 27, 1975 by Ralph G. Washburn, the disclosure of said application being hereby incorporated herein by reference.

In such oceanography systems the sensor is often connected in the bridge circuit arm through a transmission line sufficiently long to require consideration of its electrical impedance in the bridge design, and a second long transmission wire is connected in a second arm of the bridge, the two wires having equal resistances $R_c$ and being arranged so that any resistance-changing conditions affect both wires equally during operation of the system. A reference voltage is introduced into the bridge, and active control circuitry is provided to balance the bridge by controlling the currents in the bridge arms. The bridge current is then measured to provide a readout indicative of the value of the parameter being measured.

It is often desirable that the output of such measurement systems be provided in frequency form (e.g., a sine wave, or a pulse train) capable of modulating a radio frequency transmitter or producing digital data for computer interfacing. Output circuitry is provided to convert the bridge output into a system output in accordance with any desired output function. For example, the output circuitry may include a voltage controlled oscillator for providing a frequency output, as well as circuitry (not described herein) for ultimately converting the output back to a non-frequency form.

In one important class of systems to which the invention is applicable, the bridge output, although in general dependent upon the sensor resistance and the reference voltage, is independent of the reference voltage at one end of a range of values of the parameter being measured. One example of such a system is that disclosed in said application Ser. No. 608,030, wherein a grounded power source is used to supply reference, scale offset, and operating voltages to the circuit.

SUMMARY OF THE INVENTION

The invention makes possible rapid and automatic calibration, so as to make overall system accuracy primarily dependent upon a few circuit elements (in the preferred embodiment, a pair of calibration resistors, a quartz crystal reference frequency source, and elements determining the linearity of the system) which can be designed for long term (preferably at least 7 years) stability. Typical accuracies of ±0.1° C over an ambient temperature range of −40° to +50° C are achieved in the temperature measurement system of the preferred embodiment, with low cost components and circuitry easily realized in medium and large scale monolithic circuits. Power may be taken from a small battery source in the preferred embodiment.

In general, the invention features, in one aspect, first calibration circuitry connected to the output circuitry to provide a first calibration signal for calibrating the system at the end of the range at which the bridge output is independent of the reference voltage, by controlling the output function; second calibration circuitry connected to the bridge circuit to provide a second calibration signal for calibrating the system at the other end of the range by controlling the effective value of the reference voltage supplied to the bridge circuit; and sequencing circuitry for automatically causing the first calibration circuitry to calibrate the system at one end of the range, and then automatically causing the second calibration circuitry to calibrate the system at the other end of the range, and a control for activating the sequencing circuitry. In another aspect of the invention the calibration circuitries comprise phase locked loop circuitry to phase lock the measurement frequency to reference frequencies respectively corresponding to the range points; each calibration circuitry having a sample and hold circuit including a storage capacitor, and having a sampling mode in which the capacitor is charged to a level corresponding to the calibration signal, and a hold mode in which the charged capacitor provides the calibration signal; the sequencing circuitry including circuitry for automatically causing one sample and hold circuit to enter its sampling mode, then causing the other sample and hold circuit to enter its sampling mode while maintaining the first sample and hold circuit in its hold mode, and then maintaining both the circuits in their hold modes during a measurement cycle of the system. In preferred embodiments the output circuitry includes a voltage controlled oscillator for providing the system output in the form of a frequency, and offset circuitry for adding an offset voltage to the bridge output and supplying the sum to the voltage controlled oscillator, and the first calibration circuitry is connected to the offset circuitry to control the value of the offset voltage; the phase locked loop circuitry includes a frequency comparator having as inputs a frequency and the output of the conversion circuitry and as an output a control signal representative of the difference between the inputs, and the sequencing circuitry includes circuitry for connecting the output of the comparator to the first sample and hold circuit during the first calibration cycle portion and to the second sample and hold circuit during the second cycle portion; a crystal oscillation is provided for the reference frequencies, a divider being connected to the oscillator to provide a first value of the reference frequency to the first calibration circuitry and a second value of the reference frequency to the second calibration circuitry; the sequencing circuitry includes circuitry for successively connecting first and second calibration resistors in the bridge circuit in place of the sensor to carry out the calibration; and each sample and hold circuit storage capacitor has a resistor in series with it to prevent the capacitor from reducing the frequency capture range of the phase locked loop circuitry, the impedance of the resistor being larger than the impedance of the capacitor at a frequency twice the upper of the reference frequencies, and the sample mode being maintained for a period greater than the RC product of the capacitor and the resistor.

DESCRIPTION OF THE PREFERRED EMBODIMENT

Figure 1:
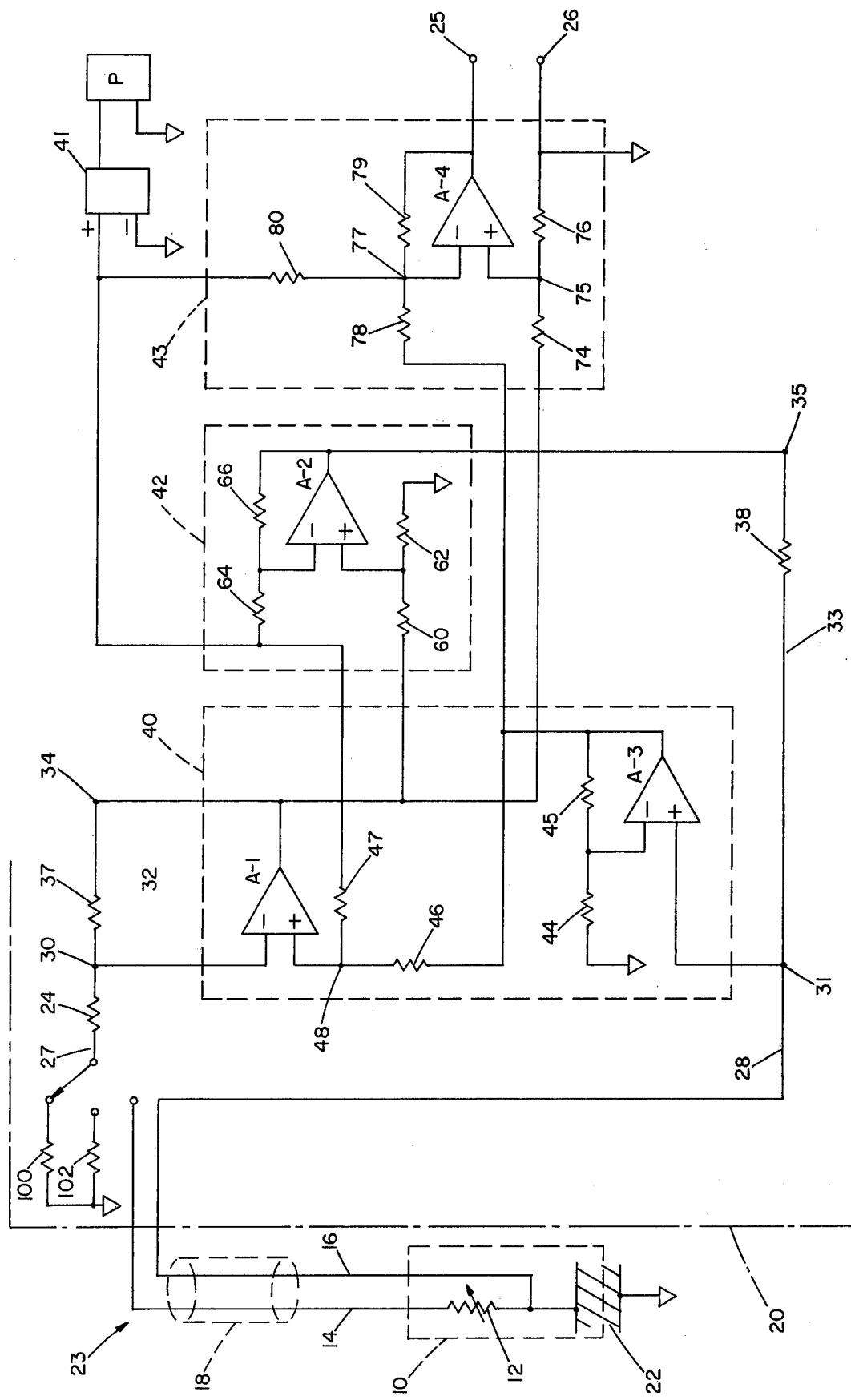
FIG. 1 shows a measurement system to which the invention is applicable.

FIG. 1 shows a measurement system to which the invention is particularly applicable.

Bathythermograph probe 10 carries a thermistor 12 the terminals of which are respectively connected to copper wires 14 and 16 of twin-wire insulated magnet wire cable 18 which extends between the probe and a measuring station 20 (e.g., a ship). The overall system may be of the sort described in U.S. Pat. No. 3,221,556, e.g., and would in that case include suitable spooling apparatus in the probe and at station 20 to enable deployment of the probe from a moving ship; such a system, using a sea electrode 22 and seawater return path to complete the circuit to the thermistor is just one of many measurement systems in which the invention can be advantageously embodied.

Cable 18 and thermistor 12 form part of measuring bridge circuit 23 which at terminals 25, 26 provides a DC output voltage $E_o$ representative of the temperature sensed by the thermistor. $E_o$ can be used, e.g., to drive a readout meter, or even to feed a computer. Resistor 24 is connected in series with thermistor 12 and has a resistance $R_1$ chosen in the middle of the thermistor resistance $(R_t)$ range over the temperature range to be measured, to provide a first order linearization of the output voltage-temperature relationship, in accordance with known thermistor output linearization circuit principles. $E_o$ is thus a function of the combined resistance $R_s$ of thermistor 12 and resistor 24, and in that sense resistor 24 can be considered as forming part of the sensor.

One leg 27 of bridge 23 is formed by wire 14, thermistor 12, and resistor 24 connected in series. A second leg 28 is formed by wire 16. The third and fourth legs 32 and 33, respectively, are formed by resistors 37 and 38 of equal value R. Control node 30 connects legs 27 and 32. Control node 31 connects legs 28 and 33. Legs 32 and 33 terminate respectively at separate current injection nodes 34 and 35.

Because of the length of cable 18, changes during operation in the resistances of wires 14 and 16, as well as changes in the resistance of sea electrode 22, are substantial enough to affect the bridge electrically. However, by ensuring that these wires have equal resistances $R_c$ ($R_c$ includes the resistance of electrode 22 which is common to legs 27 and 28), connecting them in opposite legs of the bridge (with the sea electrode common to those legs), and packaging them in a single cable so that they are exposed identically to any resistance-changing physical conditions (e.g., elongation), $E_o$ is made substantially independent of changes in $R_c$ during operation.

Operational amplifier A-1 is connected to serve as an active bridge balancing element, maintaining equal current through the arms of the bridge. To that end, active control circuitry 40 (which includes A-1) is connected with inputs from control nodes 30 and 31 and from a stable, grounded (to seawater) reference voltage source 41 (which supplies a voltage equal to twice a reference voltage $E_r$), and has its output connected to current injection node 34 to provide a controlled current I thereto; and active control circuitry 42 is connected to receive inputs from source 41 and from nodes 34 and 35, and has its output connected to deliver an equal controlled current I to injection node 35. Circuitry 40 maintains a voltage difference of $E_r$ between control nodes 30 and 31, regardless of resistance changes in sensor 12 or wires 14 and 16. Similarly, circuitry 42 maintains the voltage difference between injection nodes 34 and 35 at $E_r$. Output circuitry 43 has an input from circuitry 40 which enables it to measure the bridge current, to thereby provide on terminals 25, 26 an output voltage $E_o$ indicative of the bridge current and hence of the temperature to which the probe is exposed. Additional inputs to circuitry 43 provide for scaling, independence from transmission wire resistance, and accuracy, as explained below.

More particularly, circuitry 40 includes operational amplifiers A-1 and A-3, with associated resistors 44-7. Node 31 (at a voltage $E_c$ corresponding to current through $R_c$) is connected to the non-inverting input of A-3. A-3 acts as a buffer and (with proper choice of resistors 44 and 45) a gain of two amplifier. The output of A-3 ($2E_c$) is applied to one end of a voltage divider consisting of resistors 46 and 47, while a voltage $2E_r$ from source 41 is applied to the other end of the divider. The voltage from the mid point 48 of the divider (equal to $E_c + E_r$) is applied to the inverting input of A-1 while the controlled current output I of A-1 is connected to injection node 34, placing third arm resistor 37 in the feedback loop of A-1. Amplifier A-1 will therefore operate to control the current (I) through legs 27 and 32 so that the voltage at node 30 will be equal to $E_c + E_r$. Thus, the voltage at node 30 will be maintained at a predetermined value $E_r$ above that of node 31.

Control circuitry 42 consists of operational amplifier A-2 and its associated gain-controlling resistors 60, 62, 64, and 66. The voltage at node 34 (denoted $E_{34} = E_c30$ $E_r + IR$) is applied across a voltage divider consisting of resistors 60 and 62. The voltage from the mid-point of this divider is applied directly to the non-inverting input of A-2 while the voltage $2E_r$ from source 41 is applied to the inverting input through resistor 64. The values of resistors 60, 62, and 64, and feedback resistor 66, are chosen so as to maintain the controlled current output I of A-2 at a voltage equal to $E_{34} - E_r = E_c + IR$, and this output is connected to injection node 35 to complete the bridge loop. The effect of A-2 is to maintain junction 35 at a voltage decrement $E_r$ below junction 34. The bridge is accordingly driven to a balance at condition in which the current I through legs 27 and 32 equals that through legs 28 and 33 and is of a magnitude to make the aggregate voltage drop $(E_s)$ across the sensor resistance $R_s$ equal to the reference voltage $E_r$.

Output circuitry 43 consists of adder/subtractor operational amplifier A-4 with associated resistors 74-6 and 78-80. The output of A-1 ($E_c + E_r + IR$) is supplied to resistor 74, which forms a voltage divider network with resistor 76. The mid-point of the divider is connected to the non-inverting input of A-4. The output of A-3 ($2E_c$) is connected to resistor 78, which forms a divider network with feedback resistor 79. The divider midpoint 77 is connected through resistor 80 to source 41, and in addition is connected directly to the inverting input of A-4. The values of resistors 74-6 and 78-80 are selected so that the three voltages supplied to output circuitry 43 through resistors 74, 78, and 80, respectively, are, at the inputs of A-4, scaled in the ratio 1:0.5:1. A-4 adds $E_c +$ 2$E_r$ and subtracts the sum from the output of A-1, leaving $E_o = IR - E_r$ at the output of A-4. Thus, the input to A-4 from A-3 makes $E_o$ independent of $E_c$, and the input to A-4 from source 41 not only cancels the $E_r$ term from the output of A-1, but in addition introduces a scale offset term equal to $-E_r$.

By choosing the common value R of resistors 37 and 38 to be equal to $R_s$ at a selected lowest temperature $T_0$ on the desired measurement scale, the voltage IR at the output of A-1 will equal $E_s$ (and hence $E_r$) at $T_0$. Thus, the output of A-4 ($E_o$) at $T_O$ will be zero, which is desirable readout arrangement.

The offset voltage not only provides the desired readout scaling, but also ensures that the net voltages supplied to A-4 are within the capacity range or easily available op amps.

By using the same reference voltage source 41 to both standardize the bridge currents and provide the output offset, $E_o$ is substantially stabilized against what could otherwise be accuracy-reducing variations in $E_r$ in the low temperature portion of the measurement scale.

A-3 serves as a buffer between node 31 and the output circuitry.

Figure 2:
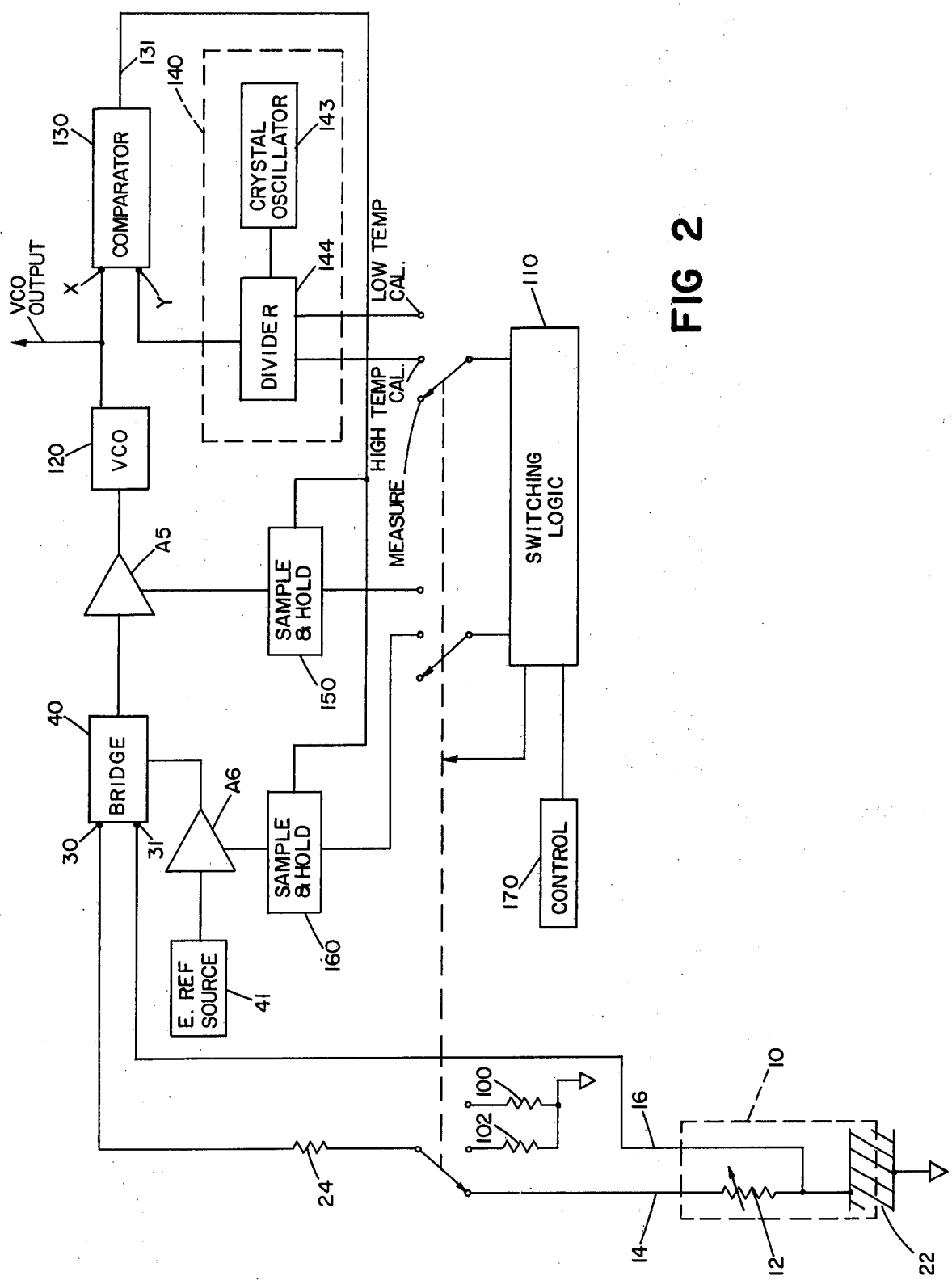
FIG. 2 is a block diagram of circuitry embodying the invention.

Referring now to FIG. 2, there are provided low temperature calibration resistor 100 and high temperature calibration resistor 102, which have values respectively equal to the thermistor resistance $R_t$ at the low temperature ($T_0$, e.g., 28° F) and high temperature (e.g., 96° F) ends of the desired meausurement scale.

Sequencing circuitry 110, consisting of conventional switching logic elements, is arranged to connect thermistor 12 to bridge node 30 when the system is in its measurement cycle (as shown in FIG. 1); to substitute resistor 100 for $R_t$ when the system is in the first (low temperature) portion of its calibration cycle; and to substitute resistor 102 for $R_t$ when the system is in the second (high temperature) portion of its calibration cycle.

Operational amplifier A-5 is connected at the bridge output to add an offset voltage to $E_o$ and to use the sum to drive voltage controlled oscillator (VCO) 120. The VCO output is taken off as the system output (or is further converted, as desired for the particular application), and is also used to feed the X input of frequency comparator 130 (which includes a conventional four-quadrant analog multiplier not shown in detail). The Y input of comparator 130 is connected to reference frequency circuit 140 which consists of a quartz crystal oscillator 143 and programmable divider 144. Under the control of sequencing circuit 110 divider 144 provides to the Y input of comparator 130 a reference frequency $f_L$ during the low temperature portion of the calibration cycle, and a different reference frequency $f_H$ during the high temperature portion of the calibration cycle. The use of divider 144 requires that $f_H$ and $f_L$ have the oscillator frequency as a common multiple, an arrangement permitting both references to be derived from the same oscillator.

Comparator 130 produces as its output a control voltage 131 proportional to the frequency difference of its X and Y inputs. During the low temperature portion of the calibration cycle the control voltage is fed to low temperature sample-and-hold circuit 150, which provides a low temperature calibration signal to the offset input of A-5, thereby controlling the offset voltage added to $E_o$. During the high temperature portion of the calibration cycle, the control voltage is fed to high temperature sample and hold circuit 160, which provides a high temperature calibration signal to the offset input of operational amplifier A-6. Operational amplifier A-6 is connected between reference voltage source 41 and the bridge, and the high temperature calibration signal controls the effective value of $E_r$ by determining the value of an offset voltage to be added by A-6 to the output of source 41.

Control 170 is provided to activate circuit 110 to cause it to sequence through the low temperature portion of the calibration cycle, the high temperature portion of the calibration cycle, and the measurement cycle, in that order.

During the low temperature portion of the calibration cycle, logic circuit 110 causes the circuit 150 to be in a "sample" state, circuit 160 to be in a "hold" state, the low temperature reference frequency to be delivered by divider 140, and resistor 100 to be connected to node 30. In this condition the input to circuit 160 is open circuited and circuit 150 is placed in a phase locked loop (PLL) with amplifier A-5, VCO 120, and comparator 130. The PLL then operates to adjust the output of sample and hold circuit 150 so that the frequency of the VCO equals the low temperature reference frequency.

During the high temperature portion of the calibration cycle, logic circuit 110 causes circuit 150 to be in a hold state, circuit 160 to be in a sample state, the high temperature reference frequency to be delivered by divider 140 and resistor 102 to be connected to node 30. In this condition the input to circuit 150 is opened while the ouptut is held, and circuit 160 is placed in a PLL with A-6, the bridge 40, A-5, VCO 120, and comparator 130. The circuit 150 then holds its previously set output and the PLL operates to adjust the output of circuit 160 so that the frequency of the VCO equals the high temperature reference frequency.

During the measurement portion of the cycle logic 110 causes each of circuits 150 and 160 to be in its hold state, and the thermistor to be connected to node 30.

Figure 3:
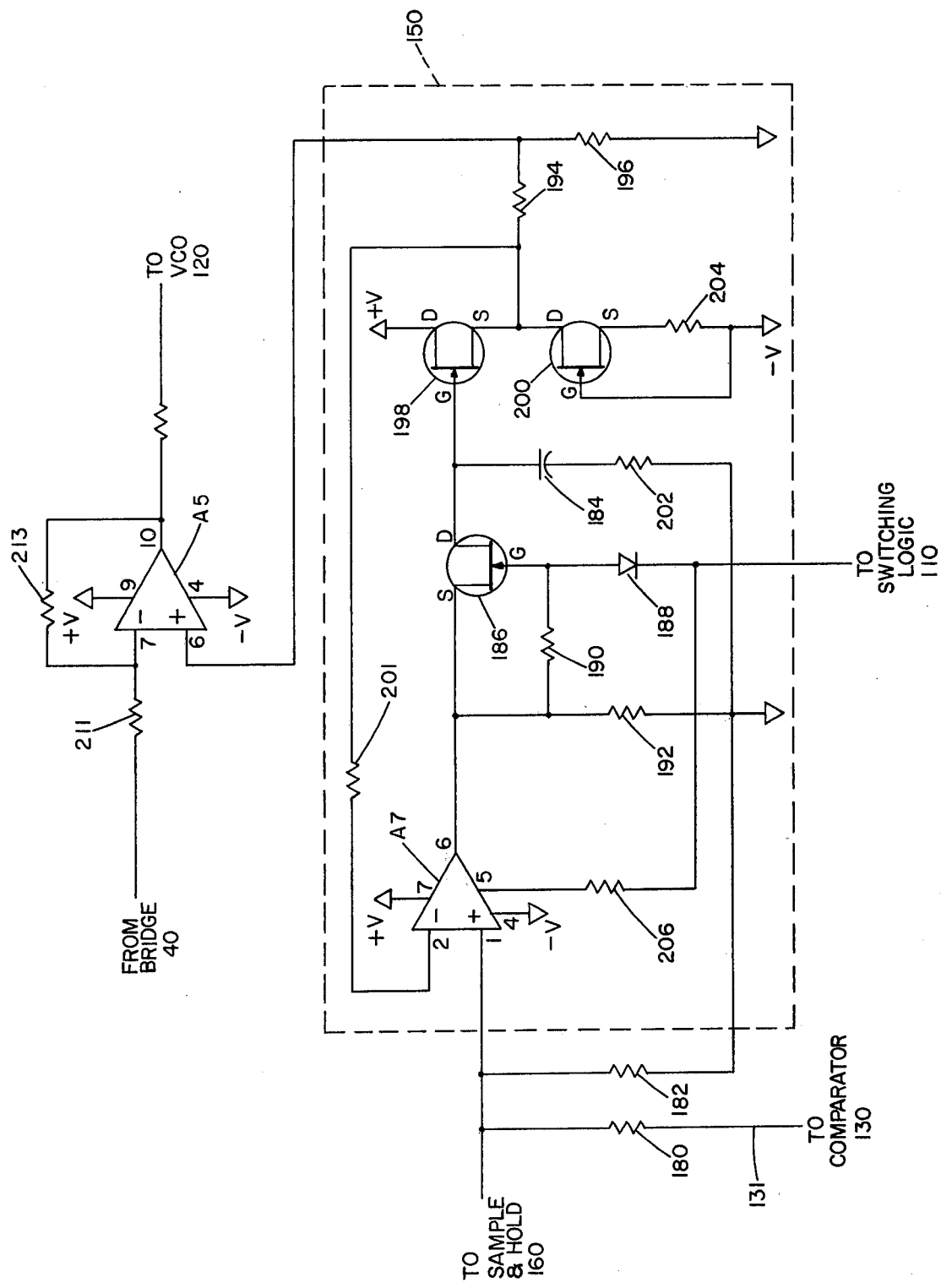
FIG. 3 is a detailed diagram of a sample and hold circuit of FIG. 2.

FIG. 3 shows the details of circuit 150, and its representative of both sample-and-hold circuits.

The output 131 of comparator 130 is fed to the non-inverting input of operational amplifier A-7 through a voltage divider network formed by resistors 180 and 182, which reduces the control voltage level to prevent overdriving of the op amp. A-7 is operated as a unity gain non-inverting amplifier and serves as a driving element for memory storage capacitor 184.

Field effect transistor (FET) 186 is connected to act as a series switch between A-7 and capacitor 184, with an extremely low value of current leakage in its off condition, to maintain nearly constant the charge on that capacitor while the other sample and hold circuit is in the PLL, and during the measurement cycle. Logic commands are fed to FET 186 from circuit 110 through diode 188. To turn on the switch the command logic goes to a voltage level of $+V$, so that the diode 188 becomes reverse biased and causes the FET gate to be connected to its source through resistor 190. When the command shifts to $-V$ the FET gate is pinched off and its source returned to ground through resistor 192, turning the switch off.

The output of the sample and hold circuit is taken off from between divider resistors 194 and 196 and is fed to A-5 as a low temperature calibration signal. FET's 198 and 200 are respectively connected to operate as a voltage controlled resistor and a constant current device, and serve as a buffer to isolate the charge on capacitor 184 from the load consisting of resistors 194 and 196. This configuration minimizes the effects on the capacitor charge of any variation in the +V and −V voltage levels. The output of the buffer, in addition to driving the load resistors, is returned back to the negative input of A-7 through resistor 201. This establishes a negative feedback loop around A-7, switch 186, and the buffer, causing the voltage driving load resistors 194 and 196 to equal the (divided) control voltage at the positive input of A-7 when switch 186 is turned on and the circuit is in the sample mode of operation. During the sample mode that voltage not only drives the load resistors to complete the phase locked loop, but is in addition impressed across the series combination of capacitor 184 and resistor 202, charging the capacitor to a voltage representing the DC component of the control voltage 131.

In the hold mode of operation, switch 186 is turned off and capacitor 184 maintains the charge received during the sample mode thus permitting the voltage on the resistors 194, 196, and hence the calibration signal fed to A-5, to remain the same as it was in the sample mode.

In order to keep switch 186 turned off it is necessary to keep its gate more negative than its source by a voltage exceeding the gate-source cutoff voltage for the particular FET used. With the negative feedback loop around A-7 broken in the hold mode, it would be possible for the output of A-7 to go to −V if the control voltage at its positive input went slightly negative with respect to its negative input. With the output of A-7 at −V it would no longer be possible to keep switch 186 turned off. To prevent this condition a so-called operational transconductance amplifier, having an additional control terminal, is used for A-7. By applying an appropriate bias current to this additional control terminal through resistor 206, it is possible to make the output of A-7 look like an open switch when the switching command signal to circuit 150 is at −V. In essence, then, there are two open switches in the hold mode of operation, A-7 and FET 186. Were it not for a high leakage current in A-7 when turned off, switch 186 could be eliminated.

To permit relatively low cost components to be used in the system it is desirable that the PLL have a wide capture range—i.e., that the PLL be able to achieve phase lock over a wide frequency range despite variation of the pre-calibration VCO nominal output frequency, due to accumulated bridge and VCO errors. To achieve a wide capture range (advantageously ±15% of the upper calibration frequency) requires that the PLL output control voltage circuit elements have a short time constant.

On the other hand, it is desirable that capacitor 184 have a high capacitance value, so that it will maintain its voltage nearly constant during the hold mode. Resistor 202 prevents the memory capacitor from reducing the capture range of the PLL, as follows: During sample mode of the AC (phase locking) component of the (divided) control voltage, which has a frequency of twice the reference frequency, will appear primarily across resistor 202, which at a frequency of twice the reference frequency has a large impedance relative to capacitor 184, while the DC component charges the capacitor. The value of resistor 202 is small enough in comparison to the leakage resistance (primarily through FET 186 and 198) to have no substantial effect on the circuit during hold mode.

Operation of the system should now be apparent. During the calibration cycle circuits 150 and 160 are successively switched into the PLL to lock the VCO output to the respective reference frequency while the respective storage capacitor is charged by the control voltage 131. The sample period is longer than the RC product of capacitor 184 and resistor 202, and advantageously about .1 sec., to permit capacitor 184 to fully charge. Capacitor 184 holds the offset of A-5 at the desired level during the high temperature portion of the calibration cycle, and both storage capacitors maintain their charges to provide calibration (offset) signals during the measurement cycle.

Components used in a typical embodiment are:

| | |
|---|---|
| $R_t$ | ranges from 18308 at 28° F to 3193 at 96° F |
| $R_1$ | 5,607 |
| R | 23,915 |
| $R_c$ | 10K |
| R 46, 47 | 16.9K |
| R 44, 45 | 8,250 |
| R 60, 66 | 10K |
| R 62, 64, 79 | 20K |
| R 78 | 10,992 |
| R 74, 80 | 5,496 |
| R 76 | 7,094 |
| R 180 | 56K |
| R 182 | 12K |
| Capacitor 184 | 0.47 µf |
| FET 186 | 2N4119 |
| diode 188 | 1N914 |
| R 190 | 10 Meg |
| R 192 | 20K |
| R 194 | 274K |
| R 196 | 34.8K |
| FET 198 | 2N4119 |
| FET 200 | 2N4119 |
| R 202 | 33K |
| R 204 | 33K |
| R 211 | 32.4K |
| R 213 | 10K |
| A-7 | CA3080 (RCA) |
| A-5, 6 | 747 |
| VCO 120 | Monolithic Function Generator XR-2206 (Exar Integrated Systems, Irvine, Calif.) |
| Comparator 130 | Operation Multiplier XR-2208 (Exar) |

Other enbodiments (e.g., using the sample and hold circuit with other types of bridge circuits, or calibrating other than by controlling the bridge reference voltage, etc.) are within the following claims.

What is claimed is:

1. In a measurement system of the type having a sensor the electrical resistance of which varies as a function of a parameter being measured, and a bridge circuit connected to said sensor, wherein a source of a reference voltage is provided to excite said bridge to produce a bridge output indicative of the parameter being measured when said bridge is balanced, said bridge output being dependent upon the sensor resistance and said reference voltage except that said system includes circuitry for causing said output to be independent of said reference voltage at one end of a range of values of said parameter, and output circuitry is provided for converting said bridge output into a system output in accordance with an output function, that improvement comprising first calibration circuitry connected to said output circuitry to provide a first calibration signal for calibrating said system at said one end of said range by controlling said output function, second calibration circuitry connected to said bridge circuit to provide a second calibration signal for calibrating said system at the other end of said range by controlling the effective value of said reference voltage supplied to said bridge circuit, sequencing circuitry for automatically causing said first calibration circuitry to calibrate said system at said one end of said range, and then automatically causing said second calibration circuitry to calibrate said system at the other end of said range, and, a control for activating said sequencing circuitry.

2. The improvement of claim 1 wherein said bridge output is a voltage, said output circuitry includes a voltage controlled oscillator for providing said system output in the form of a frequency, and offset circuitry for adding an offset voltage to said bridge output and supplying the sum to said voltage controlled oscillator, and said first calibration circuitry is connected to said offset circuitry to control the value of said offset voltage.

3. The improvement of claim 1 wherein said output circuitry includes conversion circuitry for converting said bridge output into a measurement frequency, and said calibration circuitries comprise phase locked loop circuitry to phase lock said measurement frequencies to respective reference frequencies.

4. The improvement of claim 3 wherein said first and second calibration circuitries respectively include first and second sample and hold circuits, said sequencing circuitry includes circuitry for effectively connecting said first sample and hold circuit in said phase locked loop during a first portion of a calibration cycle to adjust said first calibration signal until said measurement frequency is locked to a first said reference frequency, and said sequencing circuitry further includes circuitry for effectively connecting said second sample and hold circuit in said phase locked loop during a second portion of said calibration cycle to adjust said second calibration signal until said measurement frequency is locked to a second said reference frequency, each said sample and hold circuit having a hold mode for holding constant the value of its respective said calibration signal at times other than during its respective portion of said calibration cycle.

5. The improvement of claim 4 wherein said phase locked loop circuitry includes a frequency comparator having as inputs a said reference frequency and the output of said conversion circuitry and as an output a control signal representative of the difference between said inputs, and said sequencing circuitry includes circuitry for connecting the output of said comparator to said first sample and hold circuit during said first calibration cycle portion and to said second sample and hold circuit during said second cycle portion.

6. The improvement of claim 5 wherein each said sample and hold circuit has a memory operative after the end of its respective calibration cycle portion for holding the value of said control signal received during said cycle portion.

7. The improvement of claim 3 wherein said phase locked loop includes a crystal oscillator to provide said reference frequencies.

8. The improvement of claim 7 further comprising a divider connected to said oscillator to provide a first value of said reference frequency to said first calibration circuitry and a second value of said reference frequency to said second calibration circuitry.

9. The improvement of claim 1 wherein said sequencing circuitry includes circuitry for successively connecting first and second calibration resistors in said bridge circuit in place of said sensor to carry out said calibration.

10. The improvement of claim 1 wherein said sensor is connected to long transmission wires which are respectively in first and second arms of the bridge, said wires having equal resistances and being arranged so that any resistance-changing conditions affect both wires equally during operation of said system.

11. In a measurement system of the type having a sensor the electrical resistance of which varies as a function of a parameter being measured, and a bridge circuit connected to said sensor, wherein a source of a reference voltage is provided to excite said bridge to produce a bridge output indicative of the parameter being measured when said bridge is balanced, and output circuitry is provided for converting said bridge output into a measurement frequency in accordance with an output function, that improvement comprising first calibration circuitry for generating a first calibration signal to calibrate said system at one point in a range of values of said parameter, second calibration circuitry for generating a second calibration signal to calibrate said system at a second point in said range, said calibration circuitries comprising phase locked loop circuitry to phase lock said measurement frequency to reference frequencies respectively corresponding to said range points, each said calibration circuitry having a sample and hold circuit including a storage capacitor, and having a sampling mode in which said capacitor is charged to a level corresponding to said calibration signal, and a hold mode in which said charged capacitor provides said calibration signal, sequencing circuitry for automatically causing one said sample and hold circuit to enter its sampling mode, then causing the other sample and hold circuit to enter its sampling mode while maintaining the first sample and hold circuit in its hold mode, and then maintaining both said circuits in their hold modes during a measurement cycle of said system, and a control for activating said sequencing circuitry.

12. The improvement of claim 11 wherein each said capacitor has a resistor in series with it to prevent the capacitor from reducing the capture range of said phase locked loop circuitry.

13. The improvement of claim 12 wherein the impedance of said resistor is larger than the impedance of said capacitor at a frequency twice the upper of said reference frequencies.

14. The improvement of claim 13 wherein said sample mode is maintained for a period greater than the RC product of said capacitor and said resistor.

15. The improvement of claim 11 wherein said bridge output is a voltage, said output circuitry includes a voltage controlled oscillator for providing said system output in the form of a frequency, and offset circuitry for adding an offset voltage to said bridge output and supplying the sum of said voltage controlled oscillator, and said first calibration circuitry is connected to said offset circuitry to control the value of said offset voltage.

16. The improvement of claim 11 wherein said phase locked loop includes a crystal oscillator to provide said reference frequencies.

17. The improvement of claim 16 further comprising a divider connected to said oscillator to provide a first value of said reference frequency to said first calibration circuitry and a second value of said reference frequency to said second calibration circuitry.

18. The improvement of claim 11 wherein said sequencing circuitry includes circuitry for successively connecting first and second calibration resistors in said bridge circuit in place of said sensor to carry out said calibration.

19. The improvement of claim 11 wherein said sensor is connected to long transmission wires which are respectively in first and second arms of the bridge, said wires having equal resistances and being arranged so that any resistance-changing conditions affect both wires equally during operation of said system.

* * * * *

UNITED STATES PATENT AND TRADEMARK OFFICE
CERTIFICATE OF CORRECTION

PATENT NO. : 4,041,382

DATED : August 9, 1977

INVENTOR(S) : Ralph G. Washburn

It is certified that error appears in the above-identified patent and that said Letters Patent are hereby corrected as shown below:

Col. 2, line 43, "a frequency" should be --a reference frequency--.

Col. 2, lines 50-51, "oscillation" should be --oscillator--.

Col. 4, line 42, "(denoted $E_{34} = E_c 30 E_r + IR$)" should be --(denoted $E_{34} = E_c + E_r + IR$)--.

Col. 6, line 13, "to sequence through" should be --to sequence the system through--.

Col. 6, line 30, quotation marks deleted around "hold" and "sample".

Col. 6, line 34, "ouptut" should be --output--.

Col. 6, line 41, "in its hold state" should be --in its "hold" state--.

UNITED STATES PATENT AND TRADEMARK OFFICE
CERTIFICATE OF CORRECTION

PATENT NO. : 4,041,382
DATED : August 9, 1977
INVENTOR(S) : Ralph G. Washburn

It is certified that error appears in the above-identified patent and that said Letters Patent are hereby corrected as shown below:

Col. 6, line 60, "the" omitted between "that" and "diode".

Col. 9, line 22, "measurement frequencies" should be --measurement frequency--.

Col. 10, line 62, "the sum of said" should be --the sum to said--.

Signed and Sealed this

Twenty-first Day of March 1978

[SEAL]

Attest:

RUTH C. MASON
*Attesting Officer*

LUTRELLE F. PARKER
*Acting Commissioner of Patents and Trademarks*